(12) United States Patent
Martin et al.

(10) Patent No.: US 10,410,996 B2
(45) Date of Patent: Sep. 10, 2019

(54) INTEGRATED CIRCUIT PACKAGE FOR ASSEMBLING VARIOUS DICE IN A SINGLE IC PACKAGE

(71) Applicant: Dialog Semiconductor (UK) Limited, London (GB)

(72) Inventors: Melvin Martin, Stuttgart (DE); Baltazar Canete, Jr., Waiblingen (DE); Macario Campos, San Jose, CA (US); Rajesh Aiyandra, Ostfildern (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/367,694

(22) Filed: Dec. 2, 2016

(65) Prior Publication Data

US 2018/0158804 A1  Jun. 7, 2018

(51) Int. Cl.
*H01L 25/07* (2006.01)
*H01L 23/49* (2006.01)
(Continued)

(52) U.S. Cl.
CPC .......... *H01L 25/072* (2013.01); *H01L 23/482* (2013.01); *H01L 23/492* (2013.01); (Continued)

(58) Field of Classification Search
CPC . H01L 25/072; H01L 23/3675; H01L 23/482; H01L 23/492; H01L 23/49555;
(Continued)

(56) References Cited

U.S. PATENT DOCUMENTS 5,396,163 A * 3/1995 Nor .................. H02J 7/0086
  320/159
6,459,147 B1 * 10/2002 Crowley ........... H01L 23/49524
  257/666

(Continued)

OTHER PUBLICATIONS

"DirectFET TM—A Proprietary New Source Mounted Power Package for Board Mouted Power," by Andrew Sawle et al., International Retifier technical paper, www.irf.com, Aug. 3, 2006, 5 pages.

(Continued)

*Primary Examiner* — Didarul A Mazumder
(74) *Attorney, Agent, or Firm* — Saile Ackerman LLC; Stephen B. Ackerman

(57) ABSTRACT

An integrated circuit IC package with one or more pins protruding from the IC package for electrically connecting the IC package with a printed circuit board PCB is presented. The IC package has a first die with a first electronic component, a second die with a second electronic component, and a conductive plate having a plane surface. The first electronic component may be a semiconductor power device and the second electronic component may be a control circuit. The plane surface of the conductive plate is electrically connected to both a plane surface of the first die and one or more pins such that an electrical connection is established between the first die and the one or more pins. The second die may be arranged on top of the conductive plate. Alternatively, a third die with a third electronic component may be arranged on top of the conductive plate.

20 Claims, 13 Drawing Sheets

(51) Int. Cl.
*H01L 23/495* (2006.01)
*H01L 23/00* (2006.01)
*H01L 23/482* (2006.01)
*H01L 25/00* (2006.01)
*H01L 25/18* (2006.01)
*H01L 23/492* (2006.01)

(52) U.S. Cl.
CPC .. *H01L 23/49524* (2013.01); *H01L 23/49562* (2013.01); *H01L 23/49575* (2013.01); *H01L 24/32* (2013.01); *H01L 24/48* (2013.01); *H01L 25/18* (2013.01); *H01L 25/50* (2013.01); *H01L 23/49555* (2013.01); *H01L 2224/32245* (2013.01); *H01L 2224/48096* (2013.01); *H01L 2224/48106* (2013.01); *H01L 2224/48247* (2013.01); *H01L 2924/01047* (2013.01); *H01L 2924/01079* (2013.01); *H01L 2924/10161* (2013.01); *H01L 2924/1302* (2013.01); *H01L 2924/1305* (2013.01); *H01L 2924/13055* (2013.01); *H01L 2924/13091* (2013.01); *H01L 2924/1425* (2013.01); *H01L 2924/17724* (2013.01); *H01L 2924/17738* (2013.01); *H01L 2924/17747* (2013.01); *H01L 2924/19105* (2013.01)

(58) Field of Classification Search
CPC ......... H01L 23/49562; H01L 23/49575; H01L 24/32; H01L 24/48; H01L 25/18; H01L 25/50
USPC .......................................... 257/676; 438/123
See application file for complete search history.

(56) References Cited

U.S. PATENT DOCUMENTS

| 8,841,167 | B1* | 9/2014 | Gong | H01L 23/49562 |
| | | | | 257/E23.044 |
| 2003/0075785 | A1* | 4/2003 | Crowley | H01L 23/49513 |
| | | | | 257/676 |
| 2003/0165072 | A1* | 9/2003 | Nadd | H02M 7/003 |
| | | | | 363/147 |
| 2012/0164794 | A1* | 6/2012 | Xue | H01L 23/4952 |
| | | | | 438/123 |
| 2012/0217655 | A1* | 8/2012 | Patti | H01L 23/49562 |
| | | | | 257/777 |
| 2012/0248539 | A1* | 10/2012 | Zhang | H01L 23/49562 |
| | | | | 257/368 |
| 2012/0326287 | A1* | 12/2012 | Joshi | H01L 23/49548 |
| | | | | 257/676 |
| 2014/0117523 | A1* | 5/2014 | Ho | H01L 23/49562 |
| | | | | 257/676 |
| 2014/0284784 | A1* | 9/2014 | Yasunaga | H01L 23/52 |
| | | | | 257/690 |
| 2016/0150649 | A1* | 5/2016 | Peng | H01L 23/49822 |
| | | | | 361/761 |

OTHER PUBLICATIONS

PowerStack, white paper from Texas Instruments, "3D packaging advancements drive performance, power and density in power devices," by Matt Romig et al., Jul. 2011, pp. 1-9.

Dual Cool MOSFE, Fairchild Semiconductor Application Note, "Application Note AN-9056 Using Fairchild Semiconductor Dual Cool TM MOSFETs," by Dennis Lang, Oct. 28, 2010, https://www.onsemi.com, 9 pages.

* cited by examiner

Integrated Circuit Package for Assembling Various Dice in a Single IC Package

TECHNICAL FIELD

The present document concerns the field of integrated circuit IC packaging. In particular, the present document relates to techniques for assembling two or three dies with respective electronic components in a single IC package.

BACKGROUND

AC/DC converters serve as power supplies for a wide variety of applications. The applications range from power adapters for portable electronic devices to power supplies for networking equipment and home appliances. Typical IC packages used to implement AC/DC converters include a semiconductor power device and a digital controller for controlling the semiconductor power device. Legacy type IC packaging (such as e.g. Small Outline Integrated Circuit SOIC, Plastic Dual In-Line Package PDIP, Thin Shrink Small Outline Package TSSOP, Mini Small Outline Package MSOP, Shrink Small Outline Package SSOP, or dual flat no-leads DFN) is often used.

During packaging, dies i.e. blocks of semiconducting material are encapsulated in the IC package which serves as a supporting case for preventing physical damage and corrosion. Moreover, the IC package supports the electrical contacts (denoted as leads or pins) which connect the dies with a printed circuit board PCB to which the IC package may be attached.

In general, several design considerations need to be taken into account. For instance, the electrical characteristics of current-carrying traces that run out of a die, through the IC package, and into the PCB have to be designed carefully. Specifically, it is desirable that the latter current-carrying traces exhibit low resistance, low capacitance and low inductance.

On the other hand, mechanical reliability is an important design criteria. The IC package is responsible for keeping the chip safe from potential damage. The package must resist physical breakage and provide an airtight seal to keep out moisture. The expansion of trapped moisture can result in internal separation (delamination) of the different materials and structures. Cracks may extend to the surface of the IC package and, in the most severe cases, the entire IC package may bulge and pop. This is known as "popcorn" effect.

Finally, thermal considerations need to be taken into account. It is the duty of the IC package to provide effective heat dissipation away from a die. This holds in particular for the case of semiconductor power devices used in AC/DC converters.

SUMMARY

The present document addresses the above mentioned technical problems. In particular, the present document addresses the problem of providing an IC package which has improved electrical and thermal characteristics and is robust against delamination. The document also showcases the capability of additional functionalities in a single IC package by integrating a third silicon die. According to an aspect, an integrated circuit IC package comprises one or more pins (also denoted as leads or pads) protruding from the IC package for electrically connecting the IC package with a printed circuit board PCB. Further, the IC package comprises a first die comprising a first electronic component, a second die comprising a second electronic component, and a conductive plate having a plane surface. The conductive plate is electrically connected to the one or more pins. The plane surface of the conductive plate is electrically connected to a plane surface of the first die such that an electrical connection is established between the first die and the one or more pins. Optionally, the one or more pins may be electrically connected to said plane surface of the conductive plate.

For instance, the IC package may be a Small Outline Integrated Circuit SOIC package or a dual-flat no-leads DFN package. Alternatively, the IC package may be another gullwing-type package such as e.g. TSSMOP, MSOP, or SSOP.

A die is considered a block of semiconductor material, on which an electronic component such as e.g. the first electronic component or the second electronic component is implemented. The first electronic component may be e.g. a transistor such as a metal-oxide-semiconductor field-effect transistor MOSFET, a bipolar junction transistor BJT, an insulated-gate bipolar transistor IGBT, a MOS-gated thyristor, or another semiconductor power device. The second electronic component may be e.g. a control circuit configured to control operation of the transistor comprised in the first die.

For instance, the first electronic component comprised in the first die may be a MOSFET and the plane surface of the first die may comprise a source terminal of the MOSFET. In other words, the electrical connection established by the conductive plate may be an electrical connection between the one or more pins and the source terminal of the MOSFET. To simplify the following description, and without loss of generality, said one or more pins will be denoted as source pins. The source pins may be e.g. J-type leads or gull-wing leads which may protrude from one side—e.g. a long side—of the IC package.

The conductive plate may be e.g. a flat metal plate made of materials such as e.g. copper, silver, aluminum or gold. In particular, the conductive plate may have the shape of a flat cuboid, more particularly a flat rectangular cuboid. Therefore, the plane surface of the conductive plate may be e.g. a plane surface of rectangular shape. The skilled person will readily understand that, in practice, the plane surface of the conductive plate may not be perfectly plane in its geometrical meaning. Rather, it is assumed that the notion of a "plane" surface also covers substantially plane surfaces which are slightly uneven. Specifically, the plane surface of the conductive plate may comprise a layer with a conductive epoxy for attaching the plane surface of the conductive plate at the plane surface of the first die and/or the source pins. Put in a different way, an imperfect planarity of the plane surface of the conductive plate may be e.g. the result of a conductive epoxy layer with varying thickness. Alternatively, imperfect planarity of the plane surface of the conductive plate may not be caused by the conductive epoxy layer, but by an imperfect manufacturing process of the remainder of the conductive plate.

In the following description, the plane surface of the conductive plate will be denoted, without loss of generality, as bottom surface of the conductive plate.

The first die may essentially have the shape of a cuboid, such as e.g. a rectangular cuboid. Thus, the plane surface of the first die may be e.g. a plane surface of rectangular shape. Similar as the conductive plate, the first die may not be an ideal rectangular cuboid and the plane surface of the first die may not be perfectly plane. Rather, it is self-evident that the notion of a "plane" surface also covers substantially plane surfaces of the first die which are slightly uneven, but at least even to a large extent.

The electrical connection between the first die and the source pins may only be established via the conductive plate. In other words, the IC package may not comprise any wirebonds or similar electrical connections between the source pins and the first die. In a typical state of the art implementation, a plurality of wirebonds would carry high currents between the first die and the source pins. Compared to such an implementation, the conductive plate shows the advantage that an electrical connection with low resistance and low inductance is accomplished. At the same time, the conductive plate enables a higher heat flux compared to interconnection techniques known from the prior art, and heat generated within the IC package, in particular in the first die, may be guided away more efficiently. In summary, the conductive plate functions as a heat dissipater and a parasitic minimizer with reduced resistance and inductance.

In order to optimize the electrical and thermal characteristics of the IC package, a first contact area between the bottom surface of the conductive plate and the plane surface of the first die may be maximized. For this purpose, the dimensions of the bottom surface (e.g. its width and/or its length) may be chosen sufficiently large to cover the plane surface of the first die. Moreover, in case both the bottom surface and the plane surface of the first die have a rectangular shape, the edges of both surfaces may be aligned to maximize the overlap between the first die and the conductive plate.

In a similar way, a second contact area between the bottom surface of the conductive plate and the source pins may be increased by appropriate choice of the dimensions of the conductive plate and the source pins. For example, at least two source pins may be electrically connected within the IC package via a pinframe, and the bottom surface of the conductive plate may be electrically connected to the pinframe. In some well-known IC package types, said pinframe may also be known as leadframe.

As a further benefit, the conductive plate does not require any bended shape or any sophisticated tool for forming the conductive plate and mounting it on the first die and the source pins (or the pinframe). In contrast to prior art technologies such as e.g. technologies using copper clip conductors having a particular shape, a simple metal plate may be used to hold the first die in position and establish the electrical connection between the first die and the source pins. A flat metal plate may be easily obtained e.g. through a stamping or sawing process and can be attached to the IC package using a standard pick and place tool. Specifically, the pick and place tool used to mount the conductive plate may be the same as the pick and place tool for mounting the first die and the second die. Hence, the proposed conductive plate has the potential to significantly reduce production costs of the IC package.

The conductive plate may comprise another surface, denoted as top surface in the following, which is located on a side opposite to the side on which the bottom surface is located. Similar as the bottom surface, to which both the source pins and the first die is physically attached and electrically connected, the top surface may be substantially plane and may be e.g. of rectangular shape. The bottom surface and the top surface may form part of the overall surface of the conductive plate.

A surface of the second die may be attached to the top surface of the conductive plate such that the conductive plate is at least partially sandwiched between the first and the second die. The second die may comprise an isolation layer to electrically disconnect the first die and the second die in the described configuration. Due to the flat shape of the conductive plate with two plane surfaces, it becomes possible to efficiently arrange the first die and the second die in close vicinity to each other, namely on separate sides of the conductive plate. In other words, the conductive plate may function as a die attach paddle DAP to mount the second die or, as will be described in the following paragraph, an additional third die for multi-chip co-packaging. Thus, the conductive plate allows further miniaturization of the IC package while still achieving the above mentioned electrical and thermal performance advantages. For example, the proposed technique of sandwiching the conductive layer in between the first die and the second die is particularly advantageous in DFN packages.

Alternatively, the advantageous geometry of the conductive plate may be exploited by placing a third die on top of the conductive plate. To be more specific, the IC package may further comprise a third die comprising a third electronic component, and a surface of the third die may be attached to the top surface of the conductive plate such that the conductive plate is at least partially sandwiched between the first and the third die. The conductive plate may be configured to establish an electrical connection between the first die and the third die.

The third electronic component may be a transistor such as e.g. a MOSFET, a BJT, an IGBT, a MOS-gated thyristor, or another semiconductor power device. Alternatively, the third electronic component may be e.g. an integrated passive device IPD, i.e. the third die may comprise several arrays of resistors, inductors and/or capacitors in silicon wafer structure.

The IC package may comprise further pins, which will be denoted as drain pins in the following description. The drain pins may be e.g. J-type leads or gull-wing leads. For example, the drain pins may protrude from a long side of the IC package opposite to the side on which the source pins are located. It is a task of the drain pins to mechanically and electrically connect the IC package to the PCB.

The drain pins may be attached to a conductive holding member configured to hold the first die between the bottom surface of the conductive plate and the conductive holding member. Moreover, the conductive holding member may be configured to establish an electrical contact between the first die and the conductive holding member. In a first assembly step, the first die may be placed on the conductive holding member and, in a second assembly step, the conductive plate may be placed on top of the first die. Preferably, the conductive plate may be arranged to be parallel to a layer of the external PCB surface when the IC package is connected to the external PCB. The described assembly allows (a) fixing the position of the first die within the IC package and (b) establishing electrical connections with low resistance and inductance from the first die to both the source pins (via the conductive plate) and to the drain pins (via the conductive holding member).

An exposed surface of the conductive holding member may form part of an outer surface of the IC package such that the conductive holding member is electrically connectable with the PCB. At this, the exposed surface may extend along a plane substantially parallel to the plane surface (bottom plane) of the conductive plate. The first electronic component comprised in the first die may be a MOSFET and a non-exposed surface of the conductive holding member may be configured to establish an electrical connection between the conductive holding member and a second surface of the first die comprising a drain terminal of the MOSFET.

It should be mentioned that the source terminal and the drain terminal of the MOSFET within the first die may be interchanged. For example, the non-exposed surface of the conductive holding member may be configured to establish an electrical connection between the conductive holding member and the second surface of the first die comprising a source terminal of the MOSFET. Similarly, the plane surface of the first die—which may be electrically connected with the conductive plate—may comprise a drain terminal of the MOSFET.

For example, the exposed surface of the conductive holding member, the non-exposed surface of the conductive holding member and/or the second surface of the first die may be substantially plane (e.g. rectangular) surfaces. In addition, the latter three surfaces may be arranged in parallel to each other. The drain current of the MOSFET may then not only flow to the PCB over the drain pins, but also over the conductive holding member. To be more specific, the drain current may flow through the conductive holding member to the PCB in a direction which is perpendicular to the exposed and the non-exposed surface of the conductive holding member. Since the area of the exposed surface of the conductive holding member may be designed to be substantially larger than the accumulated contact area of the drain pins, the described configuration outperforms state of the art solutions which rely on drain pins only in terms of thermal and electrical performance. In particular, with the help of the exposed surface of the conductive holding member it becomes possible to achieve an excellent junction-to-board, junction-to-air and/or junction-to-case thermal resistance.

The conductive holding member may comprise a partly exposed conductive plate, wherein the exposed surface and the non-exposed surface are arranged on opposite sides of the partly exposed conductive plate. Moreover, the conductive holding member may comprise a downset member for electrically and mechanically connecting the partly exposed conductive plate with the drain pins. In particular, the downset member may extend from a lower level of the IC package in which the partly exposed conductive plate is situated to a higher level of the IC package in which the conductive plate is situated. Both the higher level and the lower level may be arranged in parallel to each other.

The components of the IC package may be encapsulated using a mold compound (also known as sealant) for protecting the components against moisture and physical damage. To be more specific, only the exposed surface of the conductive holding member, the source pins, the drain pins and further pins may be electrically accessible from the outside of the IC package. To improve the lockability of the mold compound with the conductive plate and to prevent delamination, at least a part of the top surface of the conductive plate may comprise some kind of texture (roughness) in the form of depressions or protrusions. The depressions may include several anchoring design variations such as dam grooves, etched dimples (i.e. U-grooves), or stamped V-grooves. For instance, said depressions or protrusions may be provided in areas of the top surface of the conductive plate which are not connected to the second die or the third die.

The IC package may further comprise at least one control pin. The second die may be wire bonded with the at least one control pin for establishing an electrical contact with the external PCB. The at least one control pin may be isolated from the source pins which are electrically connected to the conductive plate. Put in a different way, the at least one control pin is isolated from the conductive plate and the first die, too. Analogously, the at least one control pin may be isolated from the drain pins and therewith from the first die, too.

Isolating pins connected with the second die from the source pins and/or the drain pins enables a better separation between the different electrical potentials and currents within the IC package. Typically, the first die may be a semiconductor power device which is driven at a high electrical potentials and currents, whereat low electric potentials and currents are sufficient for the operation of the control circuit within the second die. Thus, isolating the second die from the source pins and/or the drain pins prevents leakage currents between both potentials during operation of the integrated circuit.

According to another aspect, a method of arranging a first electronic component and a second electronic component within an integrated circuit IC package is proposed. The method comprises providing a first die comprising the first electronic component, a second die comprising the second electronic component, and one or more pins (e.g. source pins) protruding from the IC package for electrically connecting the IC package with a printed circuit board PCB. A conductive plate having a plane surface is arranged on top of a plane surface of the first die and the one or more pins such that an electrical connection is established between the first die and the one or more pins.

Further, a conductive holding member may be attached below the first die to hold the first die between the plane surface of the conductive plate and the conductive holding member. At this, the conductive holding member may be electrically connected to further pins (e.g. drain pins) for electrically connecting the IC package with the PCB. The conductive holding member may be arranged such that an exposed surface of the conductive holding member forms part of an outer surface of the IC package such that the conductive holding member is electrically connectable with the PCB.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
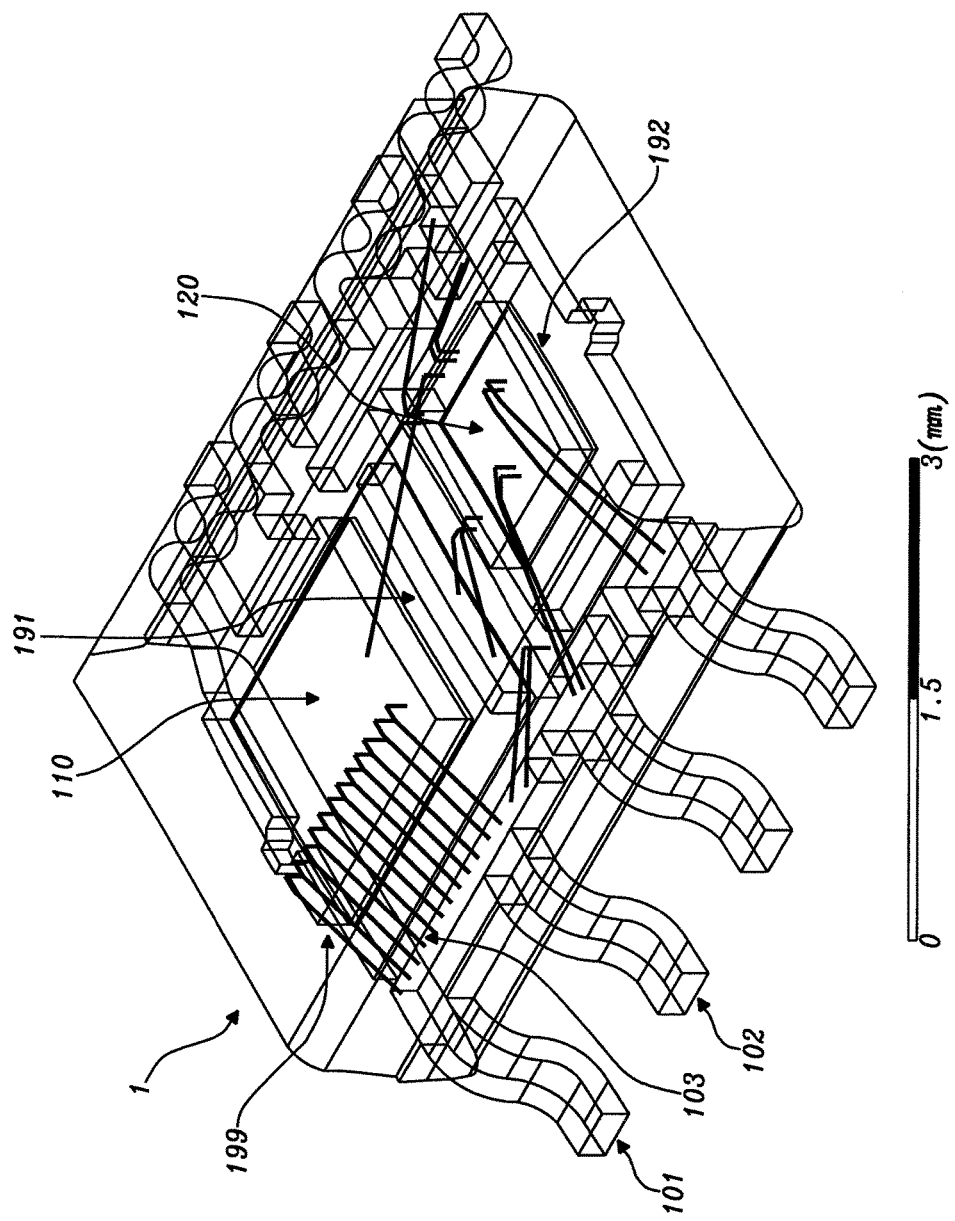
FIG. 1 shows a schematic Prior Art IC package with two dies using wire bonding.

FIG. 1 shows a schematic IC package 1 which is known from the prior art. IC package 1 is a leadframe-type package based on SOIC 8L technology with a first die 110 mounted on a first die attach paddle DAP 191 and a second die 120 mounted on a second DAP 192. Both dies 110, 120 are mounted on the respective DAPs 191, 192 using e.g. die attach glue. The first die 110 implements a MOSFET, whereas the second die 120 implements a control circuit for controlling the MOSFET. The IC package 1 is encapsulated by an epoxy mould compound EMC for mechanical protection. Twelve wirebonds 199 electrically connect the MOSFET's source terminal with a source leadframe 103, which is in turn electrically connected with two source leads 101, 102. The source leads 101, 102 may be attached to an external PCB for establishing electrical contacts. In the IC package 1 illustrated in FIG. 1, the twelve wirebonds 199 are needed to cater the high current requirements of the MOSFET.

Figure 2:
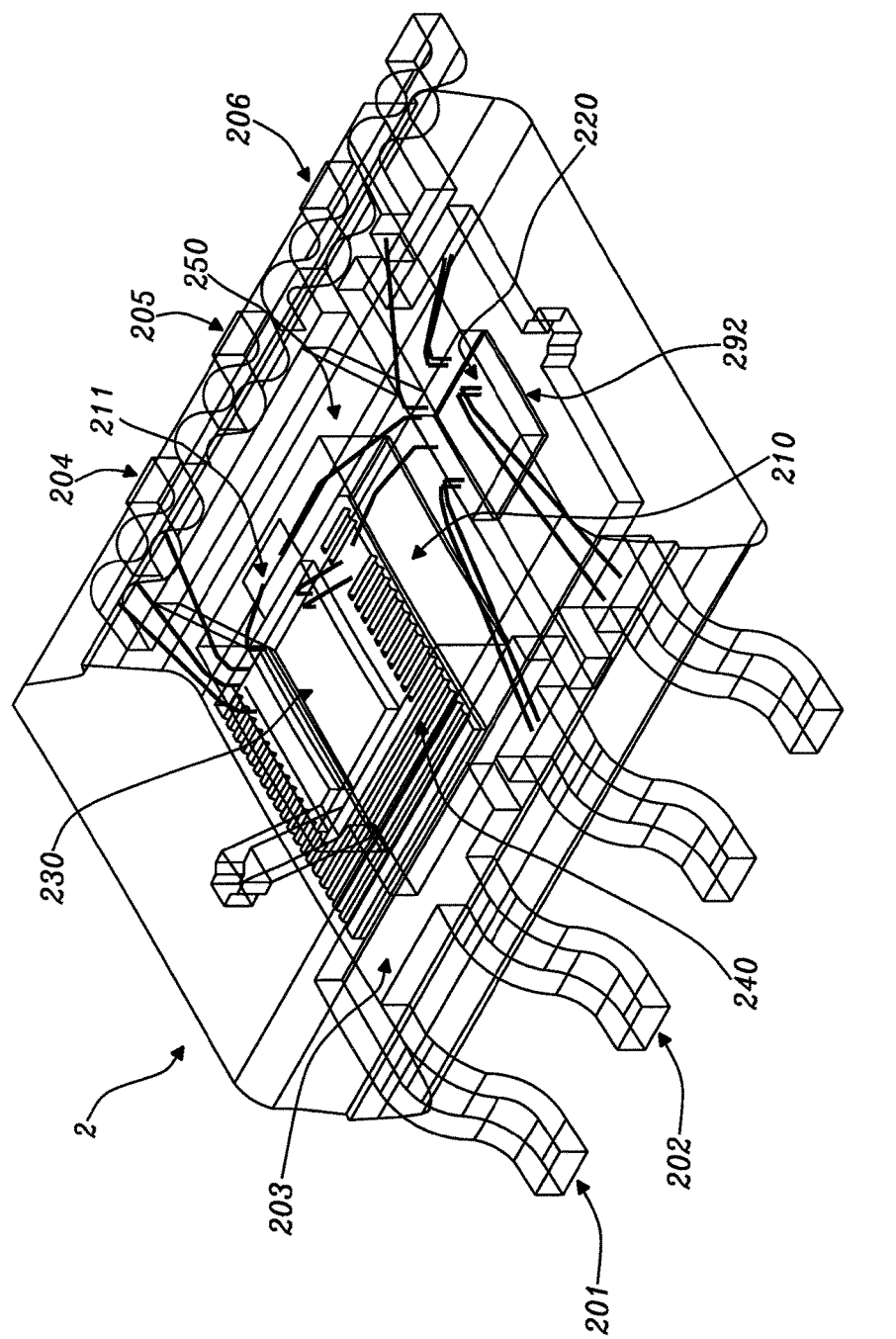
FIG. 2 shows a schematic of an exemplary IC package with three dies.

FIG. 2 shows a schematic of an exemplary IC package 2 for illustrating the ideas presented in this document. Exemplary IC package 2 may be considered as a multichip co-package with three dies. A first die 210 comprises a MOSFET. A third die 230 may be e.g. another MOSFET, a BJT, or an integrated passive device IPD. An IPD may comprise several resistors, inductors or capacitors. A second die 220 comprises a control circuit for controlling the operation of the first die 210 and the third die 230. This time, however, the first die is not connected with source leadframe 203 and source leads 201, 202 via conventional copper or gold wires. Instead, a conductive plate 240 is arranged (a) on top of the first die 210 in an area comprising the MOSFET's source terminal and (b) on top of the source leadframe 203 for establishing an electrical connection between the MOSFET's source terminal on the first die 210 and the source leads 201, 202. Specifically, a plane bottom surface of the conductive plate 240 is electrically connected to both a plane surface of the first die 210 and the source leadframe 203. Consequently, the conductive plate 240 enables an electrical connection between the MOSFET's source terminal and the source leads 201, 202.

In comparison to the wirebonds 199 in FIG. 1, the conductive plate 240 enables an electrical contact with low resistance and low inductance. Moreover, the thermal flow and thus heat dissipation from the first die 210 to the source leadframe 203 is substantially improved. At the same time, the conductive plate 240 serves as die attach paddle DAP for mounting the third die 230 on top of the conductive plate 240. In the depicted configuration, the conductive plate is at least partially sandwiched between the first die 210 and the third die 230. In FIG. 2, the second die 220 comprising the control circuit is still arranged on top of a DAP 292.

The MOSFET's gate terminal 211 is arranged on a surface of the first die 210 adjacent to (i.e. coplanar with) the plane surface of the first die 210 which is covered by the conductive plate 240. That is, the dimensions of the conductive plate 240 are chosen to cover only the MOSFET's source terminal. The MOSFET's gate terminal 211 is uncovered and may be connected via wire bonding with other components within IC package 2, such as e.g. with the control circuit within the second die 220 and/or possibly connected to the third die 230 as well.

The MOSFET's drain terminal is arranged on a surface of the first die 210 which is opposite to the surface of the first die 210 which is in contact with the conductive plate 240. As can be seen in FIG. 2, IC package 2 provides for a conductive holding member 250 for holding the first die 210 between the conductive holding member 250 and the conductive plate 240 and for establishing an electrical connection between the MOSFET's drain terminal and the three drain leads 204, 205, 206.

Figure 3:
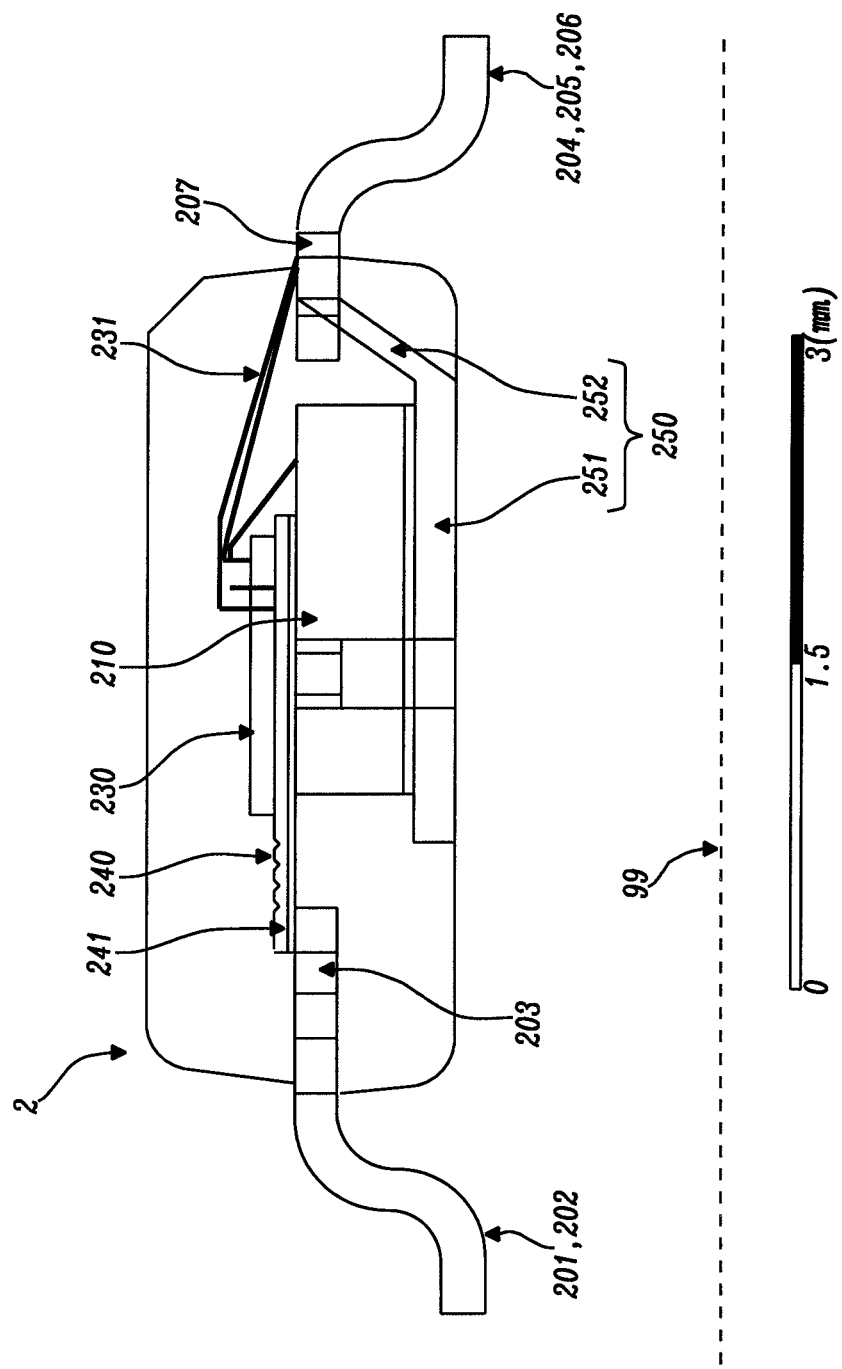
FIG. 3 shows a side view of an exemplary IC package with three dies.

FIG. 3 shows the exemplary IC package 2 from a different perspective. FIG. 3 shows a cut through IC package 2 in the region of the first die 210 and the third die 230. In FIG. 3 and all following figures, identical or similar reference numerals denote identical or similar entities within the displayed IC packages. In particular, FIG. 3 illustrates that the conductive holding member 250 actually comprises a first portion denoted as exposed conductive plate 251 and a second portion denoted as downset member 252. The exposed conductive plate 251 is arranged below the first die 210 and sandwiches the first die 210 (at least partly) between itself and the conductive plate 240. The conductive plate 240 and the exposed conductive plate 251 extend in layers which are substantially parallel to each other. Moreover, the latter layers are also parallel to a layer in which the external PCB surface extends in times when the IC package 2 is attached to the external PCB surface. The external PCB surface is indicated in FIG. 3 by a dashed line and referenced using reference numeral 99.

The exposed conductive plate 251 forms part of an outer surface of IC package 2 such that the exposed conductive plate 251 is connectable to the external PCB. Thus, the exposed conductive plate 251 may directly connect the drain of the MOSFET with the PCB. Moreover, the exposed conductive plate 251 is connected via downset member 252 with drain leadframe 207 and with the drain leads 204, 205, 206. Hence, the exposed conductive plate 251 may also indirectly connect the drain of the MOSFET with the PCB via drain leads 204, 205, 206.

The third die 230 may be further configured to establish an electrical connection to the conductive plate 240. For this purpose, at least parts of the bottom surface of the third die 230 may comprise an electrically conducting material. Again, wire bonding e.g. between the source leads 201, 202 and the third die 230 is avoided. As illustrated in FIG. 3, wirebonds 231 may connect an output terminal of the third die 230 with the drain leadframe 207.

Figure 4:
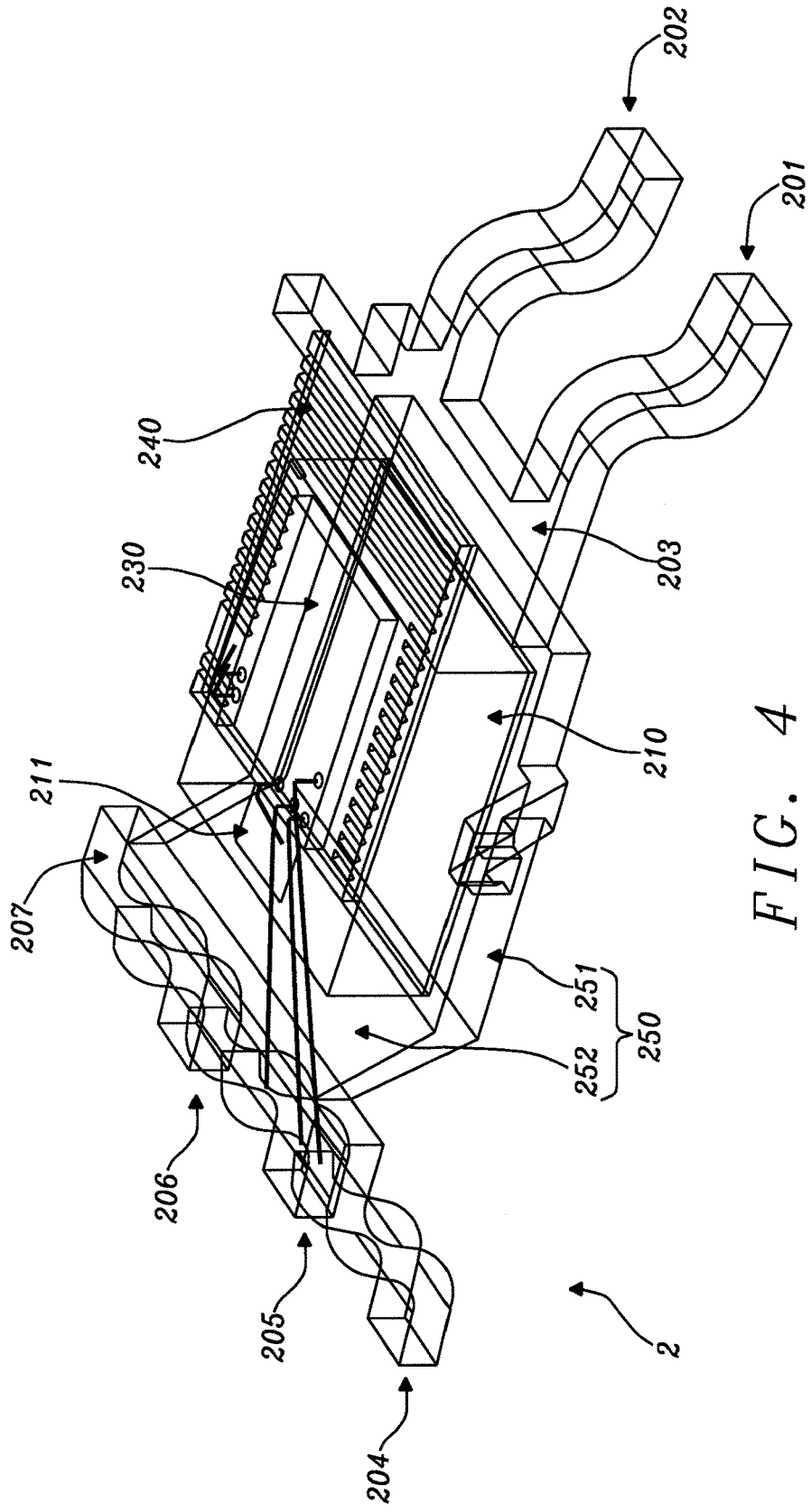
FIG. 4 shows another schematic of an exemplary IC package with three dies.

FIG. 3 further reveals that the conductive plate 240 comprises an epoxy layer 241 for gluing the conductive plate 240 to the source leadframe 203 and a top surface of the first die 210. FIG. 4 shows the IC package 2 from yet another perspective.

Figure 5:
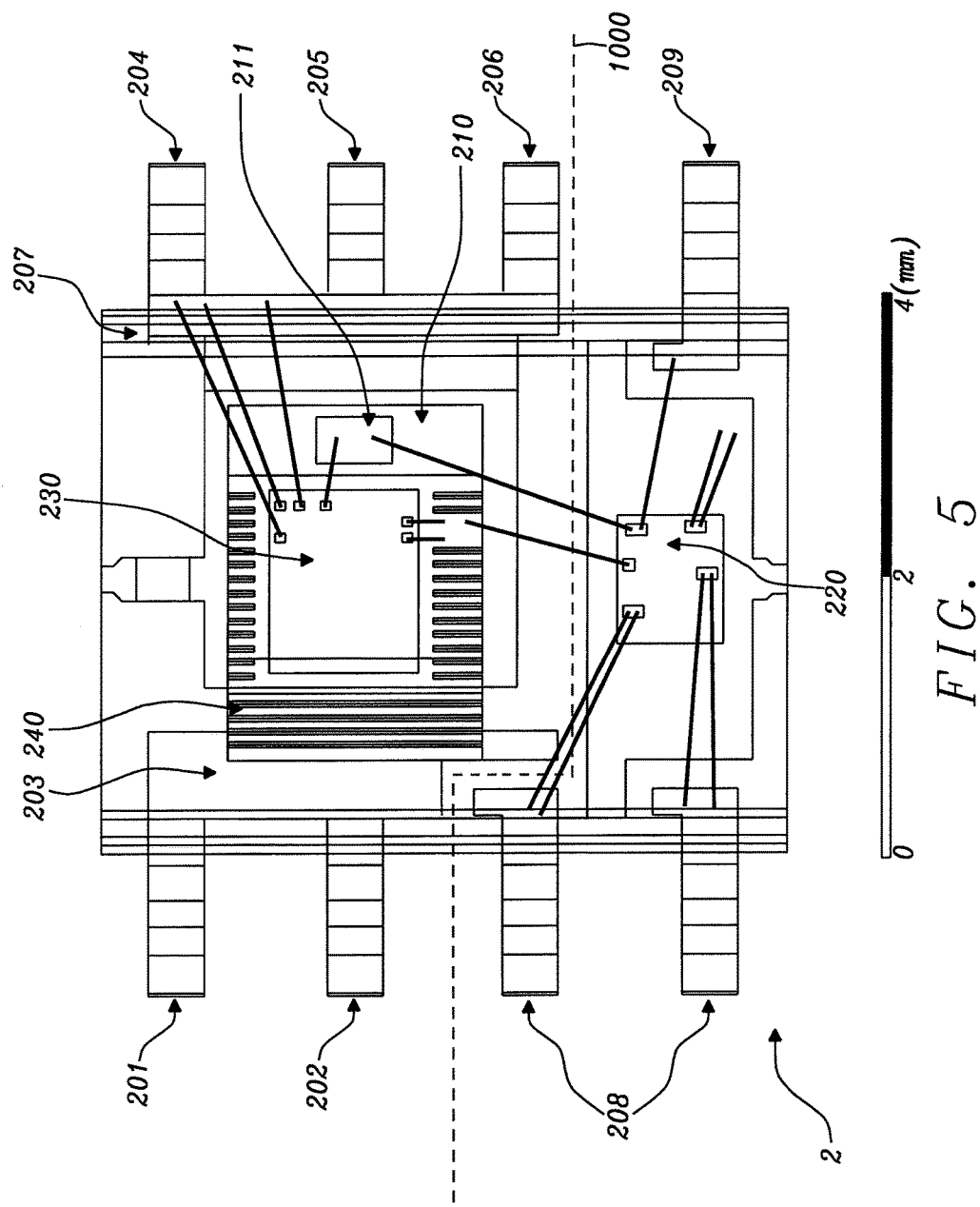
FIG. 5 shows a top view of an exemplary IC package with three dies.
Figure 6:
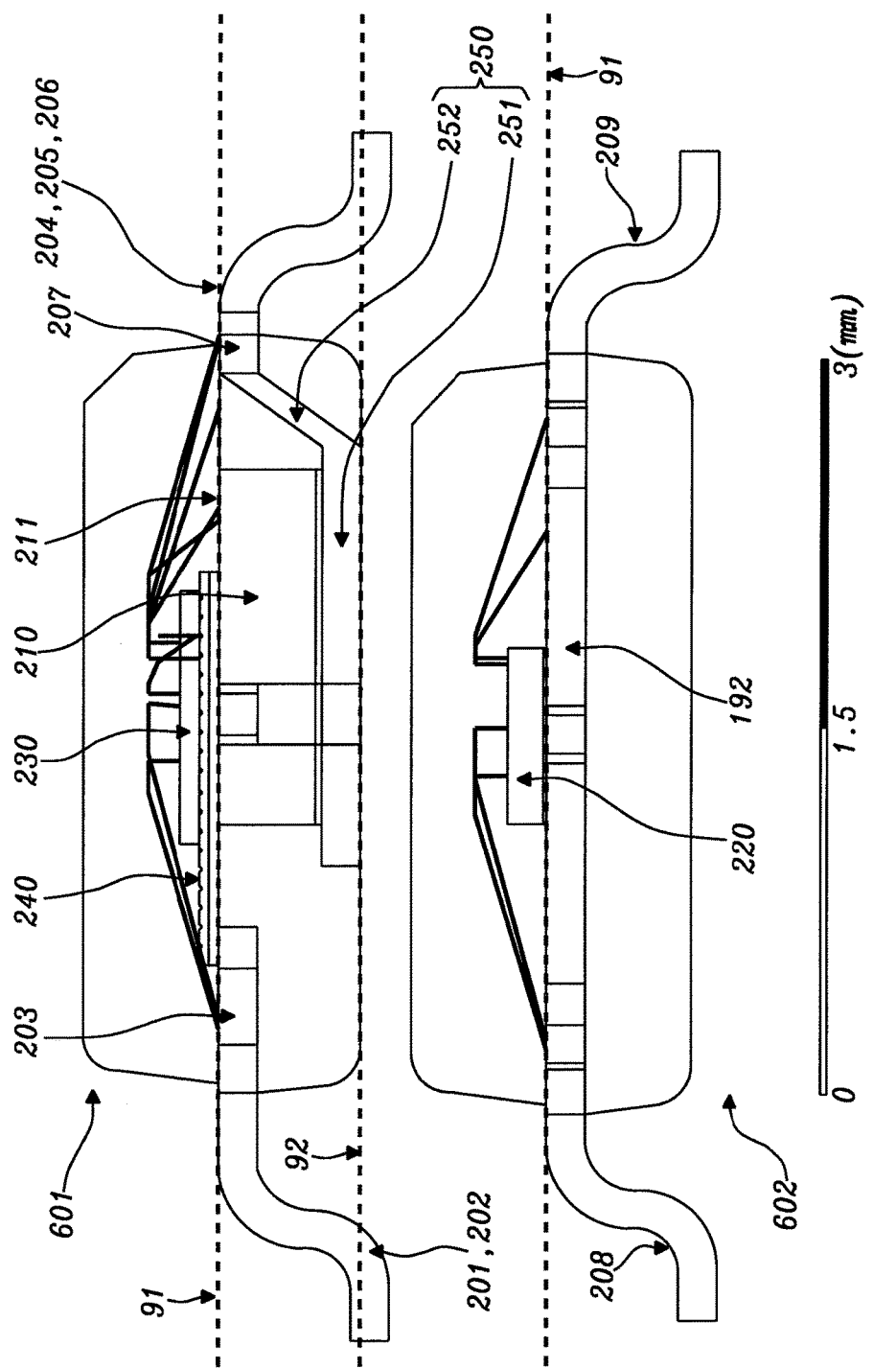
FIG. 6 shows two cuts through an exemplary IC package.

FIGS. 5 and 6 shed light on the split pad design of IC package 2 using two different kinds of downset configurations. On the one hand, FIG. 5 shows a top view on IC package 2, wherein a virtual separation line 1000 indicates that a physical gap is provided within IC package 2 between high voltage nodes connected with the first die 210 and the third die 230, and low voltage nodes connected with the second die 220.

High voltage nodes include e.g. the source leads 201, 202, source leadframe 203, the conductive plate 240, the drain leadframe 207 and the drain leads 204, 205, 206. Low voltage nodes include e.g. the second die 220 comprising the control circuit, control leads 208 which are arranged on the same side of the IC package 2 as the source leads 201, 202 (and may be connected via wirebonds with the second die 220), and control lead 209 which is arranged on the same side of the IC package 2 as the drain leads 204, 205, 206 (and may be connected via wirebonds with the second die 220). The physical gap along separation line 1000 electrically isolates the high voltage nodes from the low voltage nodes and effectively prevents any leakage currents during operation of the IC.

On the other hand, FIG. 6 shows two cuts through the IC package 2 for illuminating the different heights at which the three dies are arranged with regard to an external PCB surface. The first cut 601 is similar as the cut depicted in FIG. 3 and shows IC package 2 in the region of the first die 210 and the third die 230 (i.e. in the region of the high voltage nodes). The second cut 602 shows IC package 2 in the region of the second die 220 (i.e. in the region of the low voltage nodes). For a better comparison, FIG. 6 includes dashed lines indicating a top level 91 and a bottom level 92 of IC package 2. At the top level, the source and drain leadframes 203 and 207 are typically provided in conventional IC packages to establish electrical connections with a PCB over corresponding leads. At the bottom level, a new possibility for connecting IC package 2 with the PCB is provided via the exposed conductive plate 251. In comparison to connections via conventional leads, the exposed conductive plate 251 provides excellent heat dissipation to the PCB and an electrical connection with low resistance and inductance.

By comparing the first cut 601 with the second cut 602 in FIG. 6, it becomes evident that only conductive holding member 250 is directly connectable with the external PCB, and that DAP 192 is e.g. covered by mold compound, and thus, only connectable with the external PCB via leads 208, 209.

Moreover, when studying FIG. 6, it becomes evident that both the second die 220 and the third die 230 are positioned above the top level 91. At this, the second die 220 is mounted on top of the conductive plate 240, whereas the third die 230 is mounted on top of the second DAP 192. The first die 210, however, is located below the top level 91 and is connected via the conductive holding member 250 with the outer surface of the IC package. As a consequence, the distance between the first die 210 and second die 220 is not only increased by providing a gap along separation line 1000, but also due to the different heights/levels at which both dies are arranged within IC package 2, in particular for the MOSFET in the first die.

Figure 7:
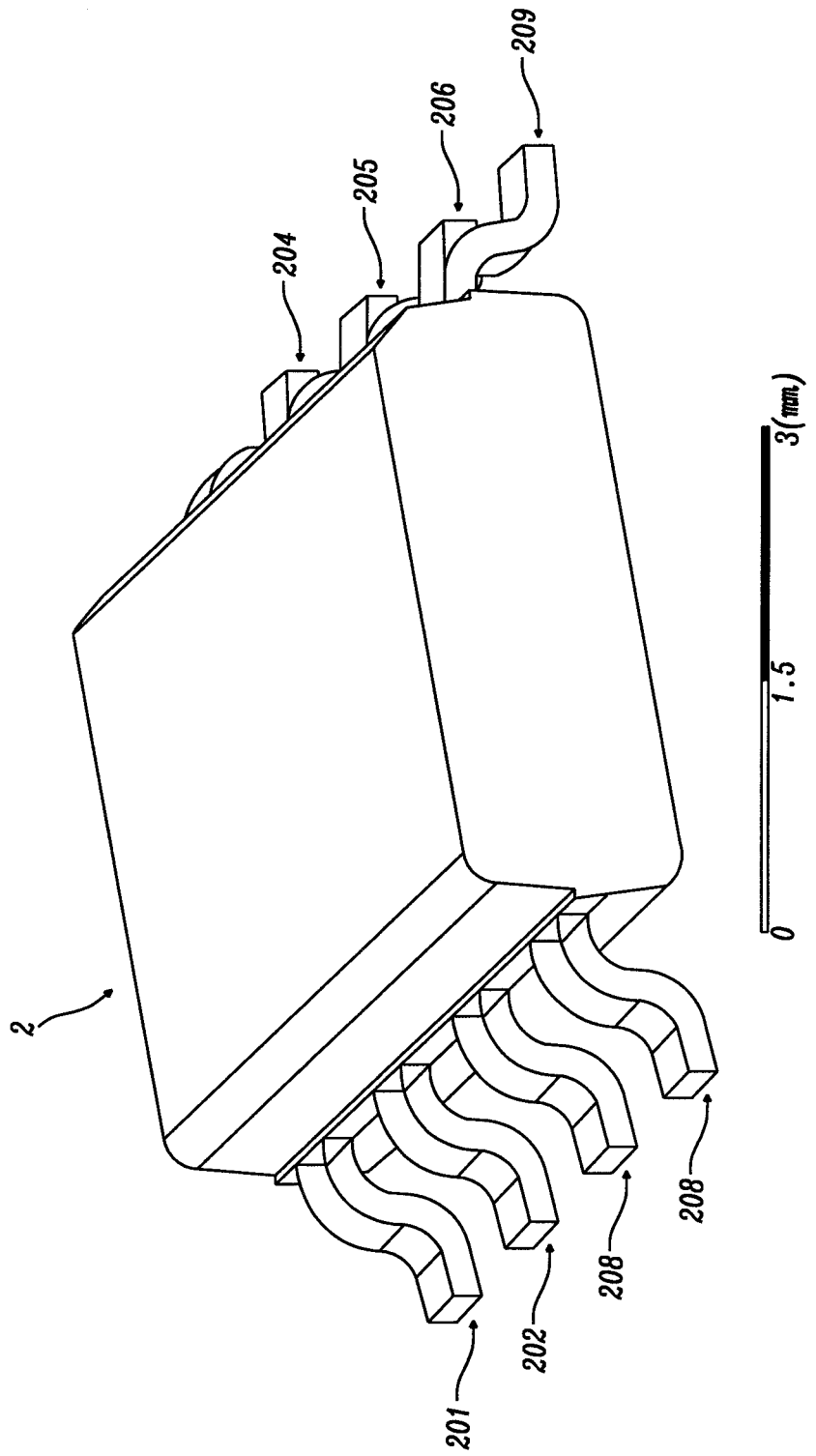
FIG. 7 shows an exterior view of an exemplary IC package.
Figure 8:
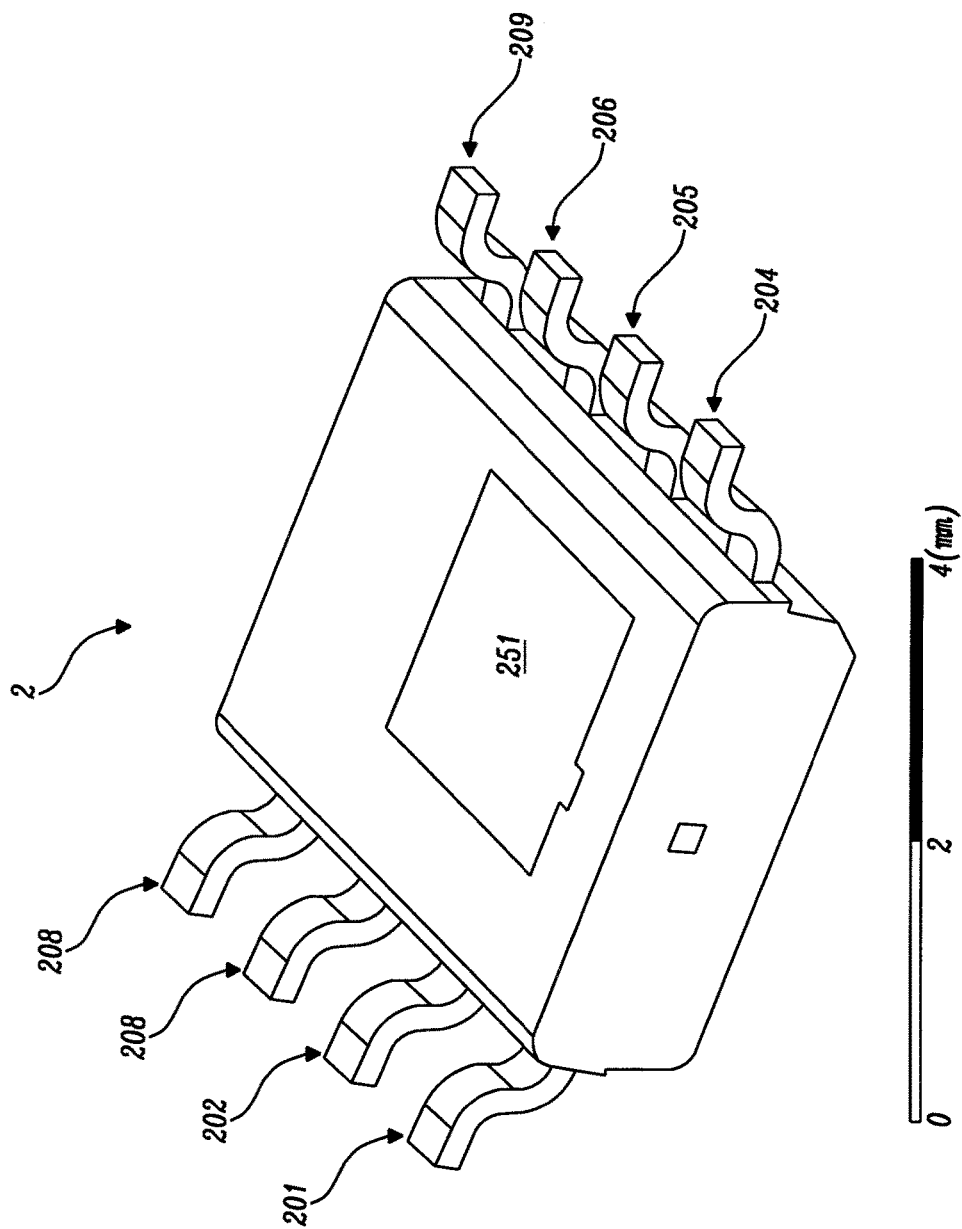
FIG. 8 shows another exterior view of an exemplary IC package with exposed die attach paddle.

FIGS. 7 and 8 show two exterior views of IC package 2 from two different perspectives. IC package 2 is electrically connectable with an external PCB via the eight leads 201, 202, 204, 205, 206, 208 and 209. In addition, at the bottom side of IC package 2, exposed conductive plate 251 is depicted. The surface of exposed conductive plate 251 may be designed large enough to allow for high currents required for semiconductor power devices arranged within IC package 2.

Figure 9:
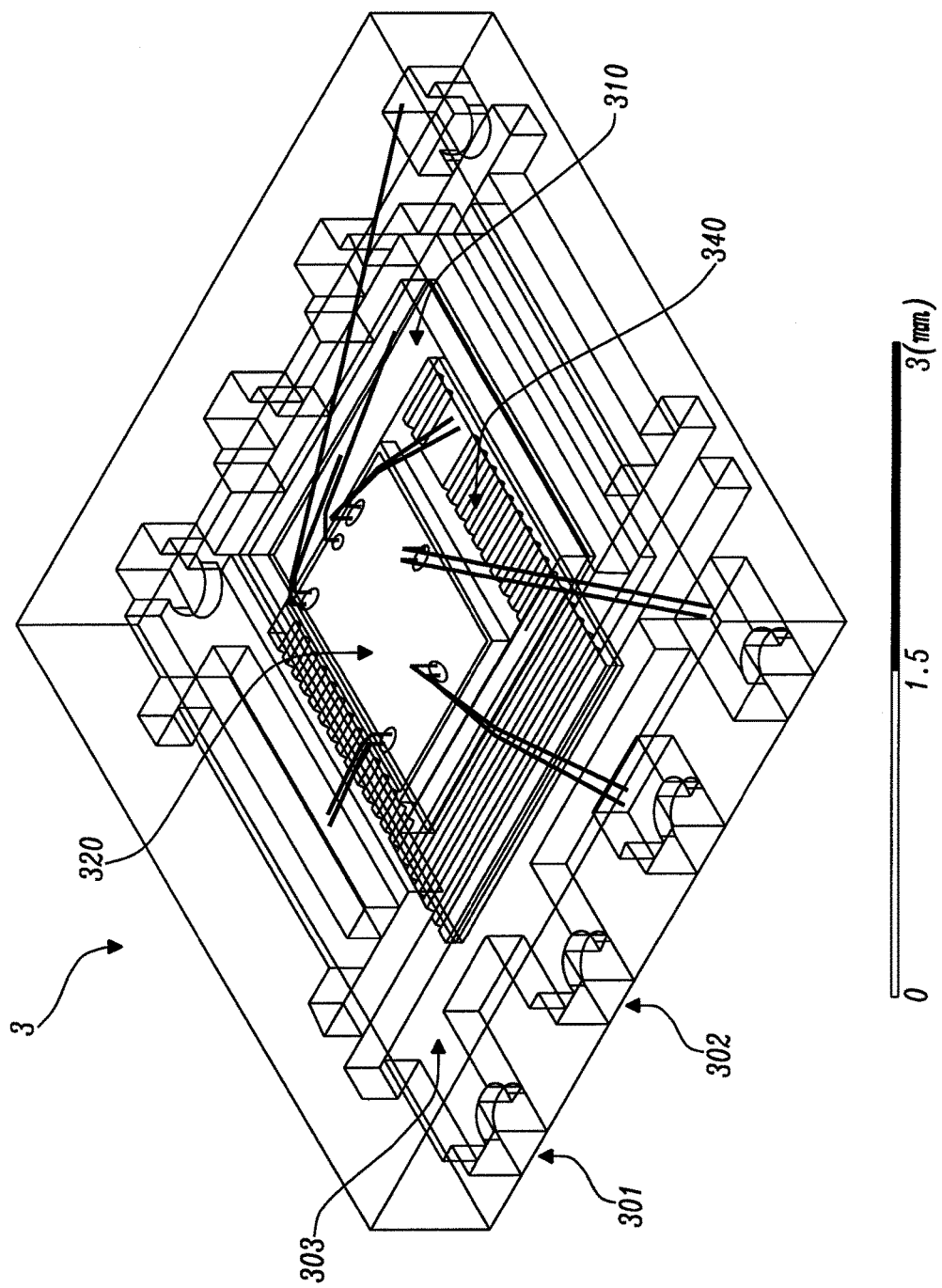
FIG. 9 shows a schematic of an exemplary smaller IC DFN package with two dies.
Figure 10:
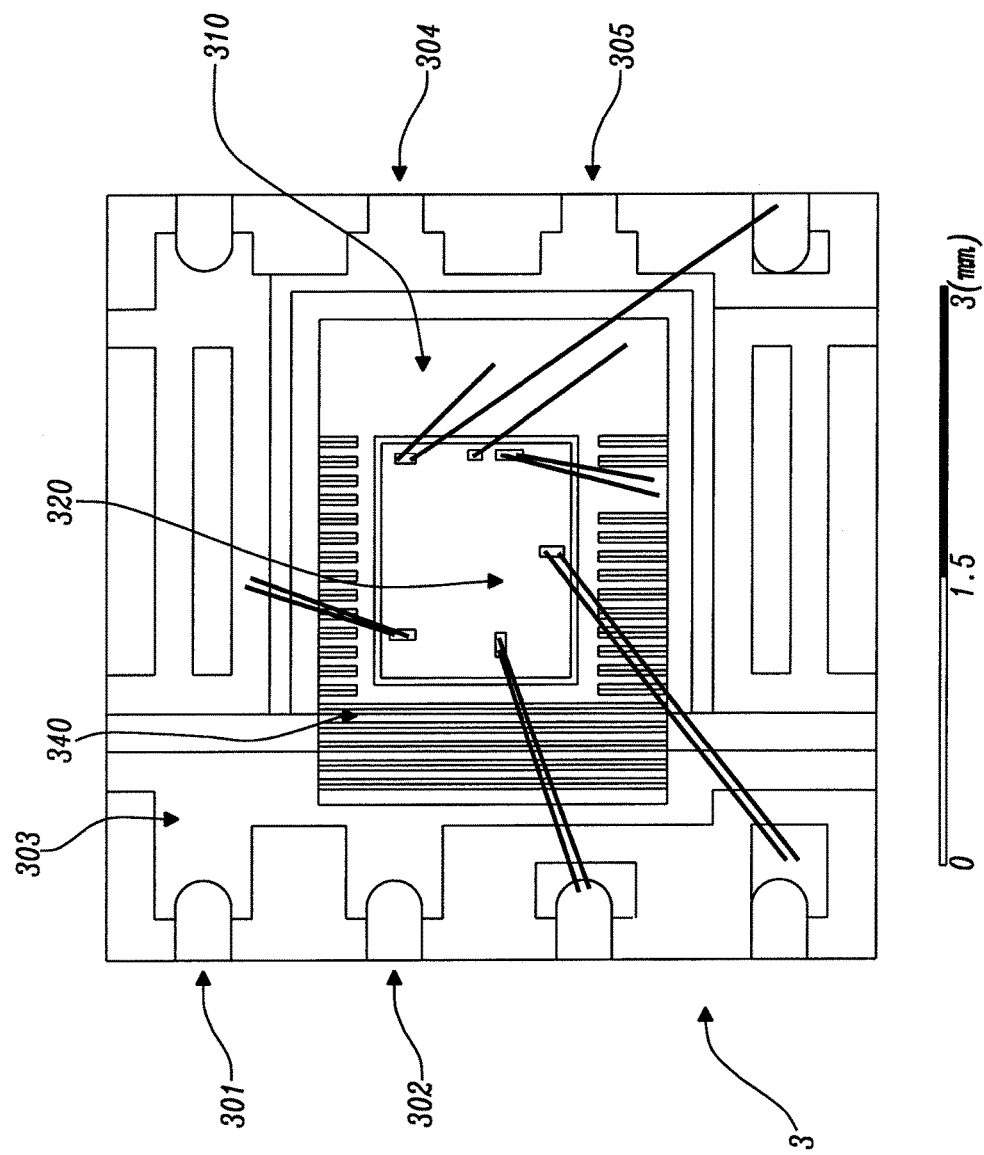
FIG. 10 shows another schematic of an exemplary smaller IC DFN package with two dies.

FIGS. 9 and 10 show different perspectives of a second exemplary IC package 3 which uses a conductive plate 340 to efficiently assembly a first die 310 and a second die 320. IC package 3 is based on DFN 8L technology and comprises two input pads/pins 301 and 302 which are connected via input frame 303 with a bottom surface of the conductive plate 340. As described in detail with regard to IC package 2, conductive plate 340 allows space-efficient assembly of both the first die 310 and the second die 320. Again, the first die 310 may be a power device and the second die 320 may be a controller for controlling the power device. The first die 310 and the second die 320 are arranged on opposite sides of the conductive plate 340.

Further, the large overlap between the conductive plate 340 and the input frame 303 enables excellent electrical and thermal properties. A conductive holding member electrically connects a drain terminal of the first die 310 (a) with the backside of IC package 3 and (b) with the output pads/pins 304, 305.

Figure 11:
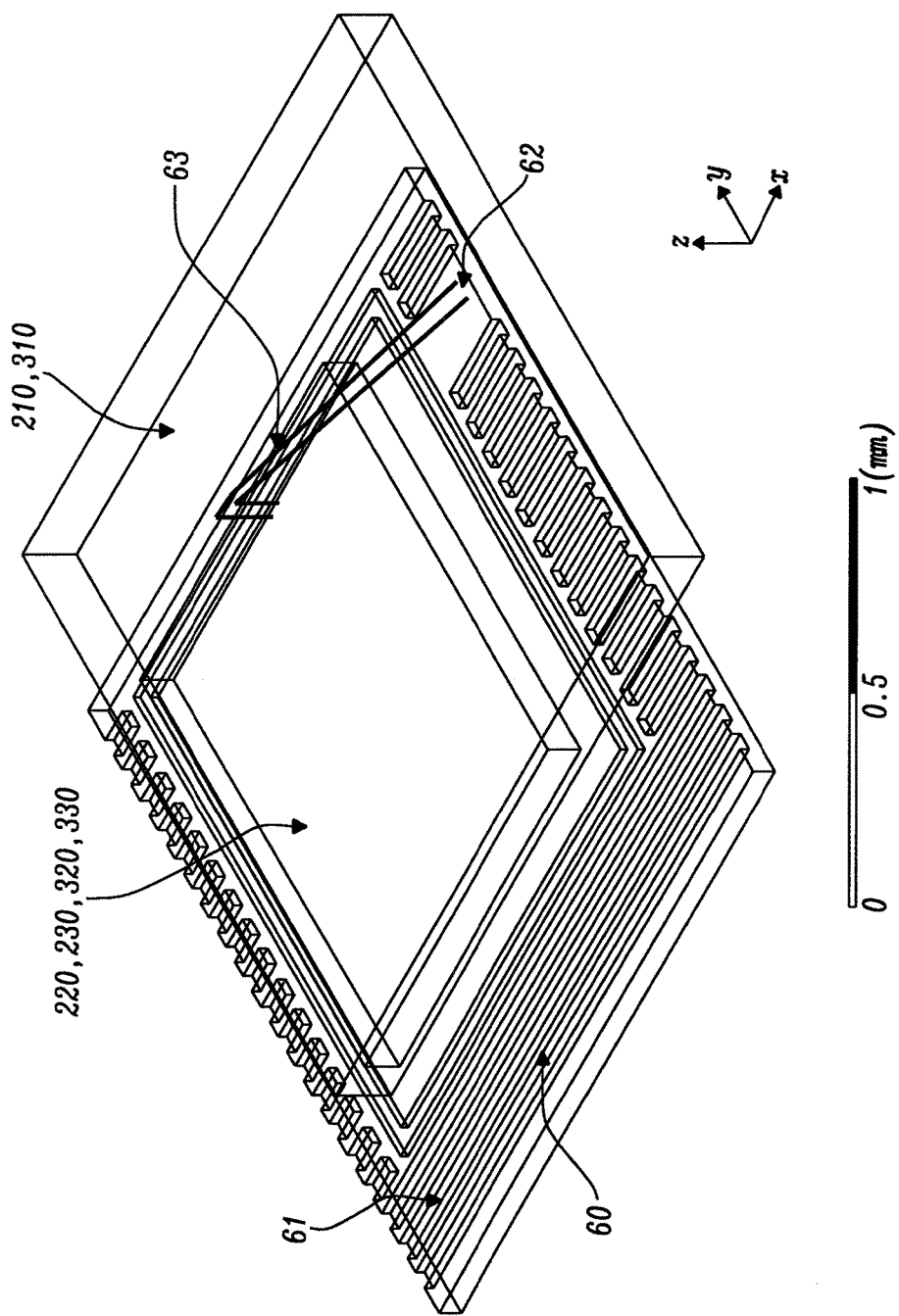
FIG. 11 shows a design variation of an exemplary conductive plate.
Figure 12:
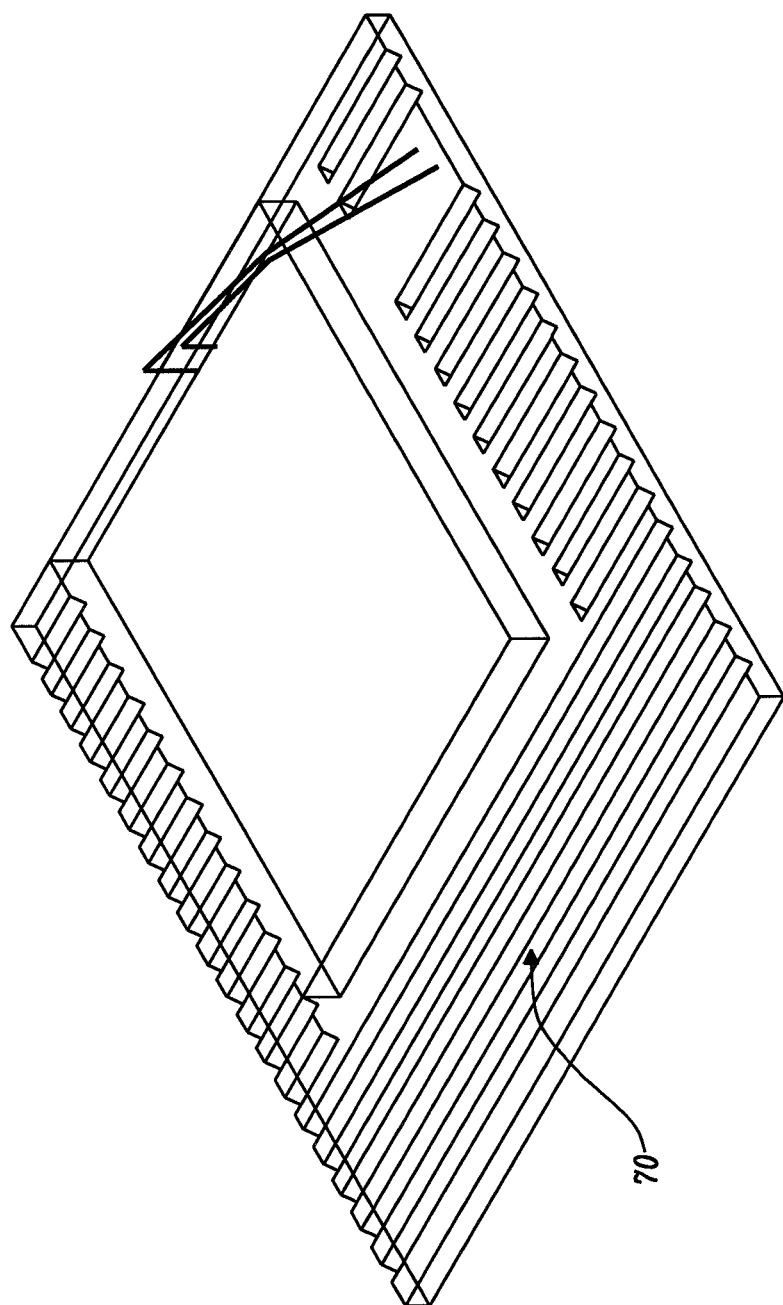
FIG. 12 shows another design variation of an exemplary conductive plate.
Figure 13:
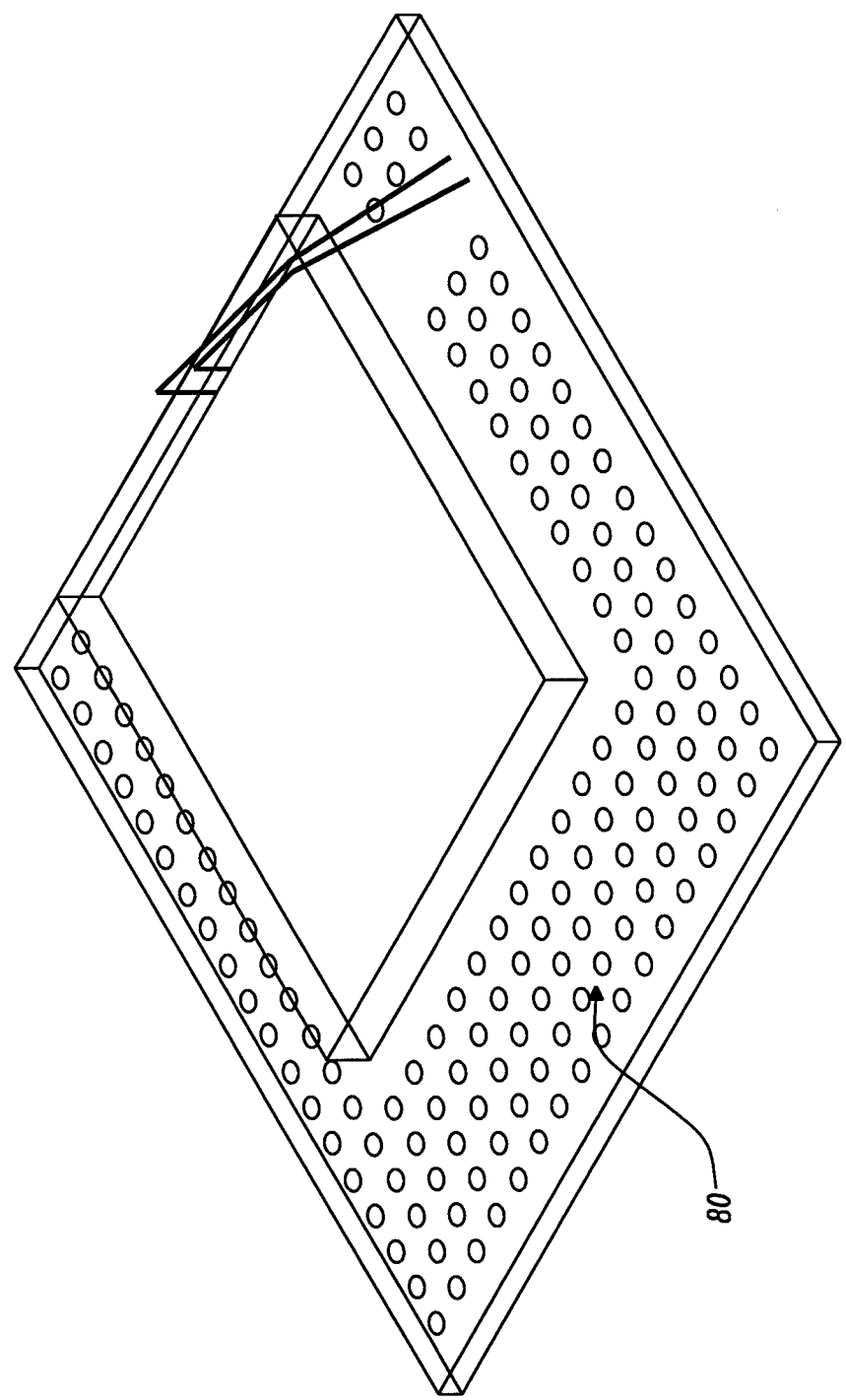
FIG. 13 shows yet another design variation of an exemplary conductive plate.

Finally, FIGS. 11, 12 and 13 show different conductive plates 60, 70, 80 which may be used in the described IC packages 2 and 3. In general, at least a part of the top surface of the conductive plate may comprise depressions or protrusions to increase mold compound lockability and avoid delamination. Said delamination may occur e.g. at the interface between the conductive plate which is made e.g. of metal and the dielectric material of the mold compound. FIG. 11 shows an exemplary conductive plate 60 with dam grooves of rectangular shape. The dam grooves may be e.g. microgrooves. In addition, FIG. 11 illustrates a trench 61 for epoxy bleed-out formed around the die 220, 230, 320, 330 which is mounted on top of the conductive plate 60. Further, FIG. 11 illustrates a reserved downbound/groundbound area 62 for wire bonding. For example, area 62 may be used to establish an electrical connection to the die on top of the conductive plate 60 via wirebonds 63.

FIG. 12 shows an exemplary conductive plate 70 with V-grooves of triangular shape. The V-grooves may be added to conductive plate 70 e.g. by stamping process. Alternatively, FIG. 13 shows an exemplary conductive plate 80 with U-grooves (e.g. dimples). The U-grooves may be added to conductive plate 80 e.g. by etching process It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An integrated circuit (IC) package comprising
a first pin and a second pin, wherein the first pin and the second pin protrude from the IC package for electrically connecting the IC package with a printed circuit board (PCB),
a pinframe extending between the first pin and the second pin, and connecting the first pin and the second pin;
a first die comprising a first electronic component,
a second die comprising a second electronic component, and a conductive plate having a shape of a flat cuboid, wherein a bottom portion of a continuous plane rectangular surface of the conductive plate is electrically connected to the pinframe and the conductive plate extends from the first die to the pinframe, wherein other bottom portion of the continuous rectangular surface of the conductive plate is connected to a top plane surface of the first die such that an electrical connection is established between the first die and the pinframe; and wherein the first die, the pinframe, the first pin, and the second pin are arranged on the same side of the conductive plate.

2. The IC package according to claim 1, wherein the first pin and the second pin are electrically connected to the continuous plane rectangular surface of the conductive plate.

3. The IC package according to claim 1, wherein the first electronic component is a transistor and the second electronic component is a control circuit configured to control operation of the transistor.

4. The IC package according to claim 1, further comprising at least one control pin, wherein the second die is wire bonded with the at least one control pin for establishing an electrical contact with the PCB, and the at least one control pin is isolated from the first pin and the second pin which are electrically connected to the conductive plate.

5. The IC package according to claim 1, wherein the electrical connection between the first die and the first pin and the second pin is only established via the conductive plate.

6. The IC package to claim 1, wherein at least a part of a surface of the conductive plate opposite to the continuous plane rectangular surface comprises depressions or protrusions.

7. The IC package according to claim 1 further comprising a third die comprising a third electronic component, wherein a surface of the third die is attached to a surface of the conductive plate opposite to the continuous plane rectangular surface such that the conductive plate is at least partially sandwiched between the first die and the third die.

8. The IC package according to claim 7, wherein the conductive plate is configured to establish an electrical connection between the first die and the third die.

9. The IC package according to claim 1, wherein a surface of the second die is attached to a surface of the conductive plate opposite to the continuous plane rectangular surface such that the conductive plate is at least partially sandwiched between the first die and second die.

10. The IC package according to claim 1, wherein the first electronic component comprised in the first die is a metal-oxide-semiconductor field-effect transistor (MOSFET) and the top plane surface of the first die comprises a source terminal of the MOSFET.

11. The IC package according to claim 1 comprising further pins, wherein said further pins are attached to a conductive holding member configured to hold the first die between the continuous plane rectangular surface of the conductive plate and the conductive holding member.

12. The IC package according to claim 11, wherein said further pins protrude from an opposite side of the IC package than the first pin and the second pin which are connected with the conductive plate.

13. The IC package according to claim 11, wherein the conductive plate is arranged to be parallel to the PCB board when the IC package is connected to the PCB board.

14. The IC package according to claim 11, wherein an exposed surface of the conductive holding member forms part of an outer surface of the IC package such that the conductive holding member is electrically connectable with the PCB.

15. The IC package according to claim 14, wherein the exposed surface extends along a plane substantially parallel to the continuous plane rectangular surface of the conductive plate.

16. The IC package according to claim 11, wherein the first electronic component comprised in the first die is a MOSFET and a non-exposed surface of the conductive holding member is configured to establish an electrical connection between the conductive holding member and a second surface of the first die comprising a drain terminal of the MOSFET.

17. The IC package according to claim 11, comprising at least one further control pin, wherein the second die is wire bonded with the at least one further control pin for establishing an electrical contact with the PCB, and the at least one further control pin is isolated from the further pins.

18. The IC package according to claim 1, wherein the first die has essentially the shape of a cuboid.

19. The IC package according to claim 1, wherein the continuous plane rectangular surface of the conductive plate comprises a conductive epoxy.

20. The IC package according to claim 1, wherein the IC package is a Small Outline Integrated Circuit SOIC package or a dual-flat no-leads DFN package.

* * * * *